(12) United States Patent
Tsugimoto

(10) Patent No.: US 10,052,690 B2
(45) Date of Patent: Aug. 21, 2018

(54) CONDUCTIVE PASTE AND GLASS ARTICLE

(71) Applicant: Murata Manufacturing Co., Ltd., Nagaokakyo-shi, Kyoto-fu (JP)

(72) Inventor: Shinichi Tsugimoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 78 days.

(21) Appl. No.: 15/364,843

(22) Filed: Nov. 30, 2016

(65) Prior Publication Data

US 2017/0080490 A1    Mar. 23, 2017

Related U.S. Application Data

(63) Continuation of application No. PCT/JP2015/064066, filed on May 15, 2015.

(30) Foreign Application Priority Data

Jun. 30, 2014    (JP) .................. 2014-133993

(51) Int. Cl.
*H01B 1/22*    (2006.01)
*B22F 1/00*    (2006.01)
(Continued)

(52) U.S. Cl.
CPC .............. *B22F 1/0014* (2013.01); *B22F 7/04* (2013.01); *C03C 3/04* (2013.01); *C03C 4/14* (2013.01);
(Continued)

(58) Field of Classification Search
CPC .... H01B 1/00; H01B 1/16; H01B 1/22; B22F 1/00; B05D 5/12
See application file for complete search history.

(56) References Cited

U.S. PATENT DOCUMENTS 5,470,643 A * 11/1995 Dorfman ................ H01C 7/005
                                                                    428/206
2012/0154229 A1    6/2012 Kagaya et al.
(Continued)

FOREIGN PATENT DOCUMENTS

| CN | 101770829 A | 7/2010 |
|----|-------------|--------|
| CN | 102474002 A | 5/2012 |

(Continued)

OTHER PUBLICATIONS

International Search Report issued for PCT/JP2015/064066, dated Jul. 7, 2015.
(Continued)

*Primary Examiner* — Mark Kopec
(74) *Attorney, Agent, or Firm* — Arent Fox LLP

(57) ABSTRACT

A conductive paste contains at least a conductive powder, glass frit, and an organic vehicle. The conductive powder contains a noble metal powder such as an Ag powder and a base metal powder containing Cu and/or Ni, and the base metal powder has a specific surface area of less than 0.5 $m^2/g$. The content of the base metal powder with respect to the total amount of the conductive powder is, in ratio by weight, 0.1 to 0.3 when the base metal powder contains Cu as its main constituent, 0.1 to 0.2 when the base metal powder contains Ni as its main constituent, and 0.1 to 0.25 when the base metal powder contains a mixed powder of Cu and Ni as its main constituent.

20 Claims, 2 Drawing Sheets

(51) Int. Cl.
| | |
|---|---|
| *H01B 1/00* | (2006.01) |
| *H01B 5/14* | (2006.01) |
| *H05K 1/09* | (2006.01) |
| *C03C 3/04* | (2006.01) |
| *C03C 4/14* | (2006.01) |
| *C03C 8/02* | (2006.01) |
| *C03C 8/18* | (2006.01) |
| *C09D 1/00* | (2006.01) |
| *C09D 5/24* | (2006.01) |
| *H05B 3/12* | (2006.01) |
| *H05B 3/84* | (2006.01) |
| *B22F 7/04* | (2006.01) |
| *C22C 29/00* | (2006.01) |
| *C03C 14/00* | (2006.01) |
| *C03C 17/04* | (2006.01) |
| *B22F 9/08* | (2006.01) |

(52) U.S. Cl.
CPC .............. *C03C 8/02* (2013.01); *C03C 8/18* (2013.01); *C03C 14/006* (2013.01); *C03C 17/04* (2013.01); *C09D 1/00* (2013.01); *C09D 5/24* (2013.01); *C22C 29/00* (2013.01); *H01B 1/00* (2013.01); *H01B 1/22* (2013.01); *H01B 5/14* (2013.01); *H05B 3/12* (2013.01); *H05B 3/84* (2013.01); *H05K 1/09* (2013.01); *H05K 1/092* (2013.01); *B22F 9/082* (2013.01); *B22F 2007/047* (2013.01); *B22F 2301/10* (2013.01); *B22F 2301/15* (2013.01); *B22F 2301/255* (2013.01); *B22F 2302/253* (2013.01); *B22F 2302/256* (2013.01); *B22F 2304/10* (2013.01); *C03C 2204/00* (2013.01); *C03C 2207/00* (2013.01); *C03C 2214/08* (2013.01); *C03C 2217/452* (2013.01); *C03C 2217/479* (2013.01); *H05B 2203/005* (2013.01); *H05B 2203/011* (2013.01); *H05B 2203/017* (2013.01)

(56) References Cited

U.S. PATENT DOCUMENTS

| | | | |
|---|---|---|---|
| 2014/0018482 A1* | 1/2014 | Dorfman | H01B 1/22 524/314 |
| 2014/0026953 A1 | 1/2014 | Zhang et al. | |
| 2014/0063684 A1* | 3/2014 | Lee | H01G 4/30 361/301.4 |
| 2015/0299477 A1 | 10/2015 | Yoshii | |

FOREIGN PATENT DOCUMENTS

| | | |
|---|---|---|
| CN | 102855959 A | 1/2013 |
| JP | H06-309921 A | 11/1994 |
| JP | H09-35530 A | 2/1997 |
| JP | 3960921 B2 | 8/2007 |
| JP | 2012-238443 A | 12/2012 |
| JP | 2014-510990 A | 5/2014 |
| WO | 2014/081765 A1 | 9/2016 |

OTHER PUBLICATIONS

Written Opinion of the International Searching Authority issued for PCT/JP2015/064066, dated Jul. 7, 2015.

* cited by examiner

CONDUCTIVE PASTE AND GLASS ARTICLE

CROSS REFERENCE TO RELATED APPLICATIONS

The present application is a continuation of International application No. PCT/JP2015/064066, filed May 15, 2015, which claims priority to Japanese Patent Application No. 2014-133933, filed Jun. 30, 2014, the entire contents of each of which are incorporated herein by reference.

FIELD OF THE INVENTION

The present invention relates to a conductive paste and a glass article, and more particularly, a conductive paste for forming anti-fogging hot wires, antenna patterns, and the like provided on window glass for vehicles such as automobiles, and to a glass article such as anti-fogging glass and a glass antenna, obtained with the use of the conductive paste.

BACKGROUND OF THE INVENTION

Conventionally, for window glass of vehicles such as automobiles, glass articles are used such as anti-fogging glass provided with anti-fogging hot wires, and glass antennas for receiving ratio waves from the outside of vehicles. Of these glass articles, for example, anti-fogging glass typically has a conductive film formed in a predetermined pattern by applying a conductive paste in the form of lines onto a glass substrate, and then the paste is fired. Various types of paste have been developed and proposed for this purpose.

For example, Patent Document 1 proposes a conductive paste for producing conductive coatings on glass, ceramics, or porcelain enamel steel. The conductive paste includes conductive silver particles, conductive particles containing at least one base metal, one or more types of glass frit, and a paste formation medium. The base metal-containing conductive particles are substantially composed of iron, cobalt, nickel, copper, zinc, or an alloy including at least one of the elements. The average particle size $D_{50}$ of the base metal-containing conductive particles falls within the range of 0.1 μm to 15 μm, the specific surface area thereof falls within the range of 0.5 $m^2$/g to 10 $m^2$/g, and the base metal-containing conductive particles account for up to 80 weight % of the whole conductive particles. The softening temperature (by heating microscope) of the one or more types of glass frit falls within the range of 350° C. to 600° C., and the hemisphere temperature thereof falls within the range of 450° C. to 700° C.

This Patent Document 1 is intended to achieve a conductive paste which has a stable resistivity of approximately 37 to 40 μΩ·cm even when the firing temperature varies in the range of 660 to 680° C.

Patent Document 1: Japanese Patent No. 3960921 (claim 1; paragraphs [0009], [0019] to [0021], Table 2, etc.)

SUMMARY OF THE INVENTION

However, Patent Document 1 exhibits problems of inferior weather resistance, and high resistivity for the following reasons.

More specifically, when the conductive paste contains therein base metal particles, the base metal particles consume oxygen in the conductive film through an oxidation reaction during firing, thereby locally decreasing the oxygen partial pressure. Then, when the oxygen partial pressure is decreased, the oxygen adsorbed on the surfaces of noble metal particles will be reduced, thereby decreasing the wettability of the glass frit as an oxide. In this case, slow oxidation of the base metal particles results in a minor decrease in wettability because oxygen is rapidly supplied to the conductive film from the surroundings of the base metal particles, while rapid oxidation of the base metal particles results in a significant decrease in wettability.

However, when the wettability of the glass frit is decreased as described above, the ingress of the glass frit into the voids is blocked, thus degrading the weather resistance. More specifically, when the conductive film is exposed to the air with unfilled voids left at the interface between the glass substrate and the conductive film, and comes into contact with an acid, salt water, or the like, there is a possibility of causing erosion due to the ingress of the acid or salt water into the interface between the conductive film and the glass substrate, and thereby causing the interface strength between the glass substrate and the conductive film to be decreased.

In addition, the decreased wettability of the glass frit interferes with liquid-phase sintering, thus decreasing the sintered density of the conductive film. This creates a possibility of increasing the resistivity, thereby causing a decrease in conductivity.

In order to suppress the increase in resistivity, it is possible to increase the line width of the conductive film or increase the film thickness thereof. However, in this case, due to the increased amount of the conductive paste used, there is a possibility of causing the cost to be increased, which is not preferable for at least the perspective of resource saving. In particular, while the resistivity is generally 20 μΩ·cm or more in Patent Document 1, the control of the resistivity to approximately 18 μΩ·cm or less is thought to be preferable, because mainstream battery voltages of vehicles and the like are 12 to 24 V.

The present invention has been made in view of these circumstances, and an object of the invention is to provide a conductive paste which has favorable weather resistance, and moderately controllable resistivity, and a glass article such as anti-fogging glass and a glass antenna, with the use of the conductive paste.

The inventors have earnestly carried out studies to achieve the above object, and found that a conductive paste that includes a conductive powder that contains a base metal powder having a predetermined amount of Cu powder and/or Ni powder that is relatively unlikely to be oxidized, and that the base metal powder has a specific surface area of less than 0.5 $m^2$/g, slows the oxidation of base metal particles during firing, and thus making it possible to inhibit rapid oxidation. As a result, ingress of glass frit into voids between noble metal particles and a glass substrate can occur and create a seal from the external environment, thereby making it possible to achieve favorable weather resistance and control resistivity moderately.

The present invention has been made based on this finding, and a conductive paste according to the present invention is a conductive paste comprising at least a conductive powder, glass frit, and an organic vehicle. The conductive powder contains a noble metal powder and a base metal powder containing at least one of Cu and Ni, and the base metal powder has a specific surface area of less than 0.5 $m^2$/g. A content of the base metal powder with respect to a total amount of the conductive powder is, in ratio by weight: 0.1 to 0.3 when the base metal powder contains the Cu as its main constituent; 0.1 to 0.2 when the base metal powder contains the Ni as its main constituent; and 0.1 to 0.25 when the base metal powder contains a mixed powder of the Cu and the Ni as its main constituent.

In the conductive paste according to the present invention, the base metal powder is preferably an atomized powder prepared by an atomization method.

In the conductive paste according to the present invention, the base metal powder is preferably 8 µm or less in average particle size.

In the conductive paste according to the present invention, the base metal powder is preferably 2.5 µm or more in average particle size $D_{50}$.

Furthermore, in the conductive paste according to the present invention, the noble metal powder is preferably 0.1 to 3 µm in average particle size $D_{50}$.

In addition, in the conductive paste according to the present invention, a content of the conductive powder is preferably 50 to 90 wt %.

In addition, in the conductive paste according to the present invention, an average particle size $D_{50}$ of the glass frit is preferably 2 times or less of the average particle size of the noble metal powder.

Furthermore, in the conductive paste according to the present invention, the glass frit preferably has a softening point of 350° C. to 600° C.

In addition, in the conductive paste according to the present invention, the noble metal powder preferably contains Ag as its main constituent.

In addition, a glass article according to the present invention includes a substrate and a conductive film in a predetermined pattern formed on the substrate, wherein the conductive film is obtained by applying the conductive paste according to any of the embodiments of the present invention onto the substrate and sintering the paste sintered.

In addition, in the glass article according to the present invention, a ceramic layer is also preferably interposed between the glass substrate and the conductive film.

It is to be noted that the average particle size is referred to as a particle size corresponding to 50% of the cumulative distribution, that is, a median size (hereinafter, an "average particle size $D_{50}$") in the present invention.

With the conductive paste according to the present invention, the oxidation of the base metal particles during firing is made slow, thus making it possible to inhibit rapid oxidation, and accordingly, while maintaining the wettability of the glass frit, ingress of the glass frit into voids between the noble metal particles and a glass substrate can create a seal from the external environment.

Therefore, the use of the present conductive paste can achieve various types of glass articles which have favorable weather resistance, and also moderately controllable resistivity.

In addition, when using the conductive paste of the present invention to create a glass article, a seal from the external environment can be created as described above, thereby making it possible to achieve glass articles such as anti-fogging glass and glass antennas, which have favorable weather resistance and favorable conductivity with resistivity moderately controllable even when applying voltages of 12 to 48 V, which are common battery voltages of vehicles.

DETAILED DESCRIPTION OF EMBODIMENTS OF THE INVENTION

Next, embodiments of the present invention will be described in detail.

Figure 1:
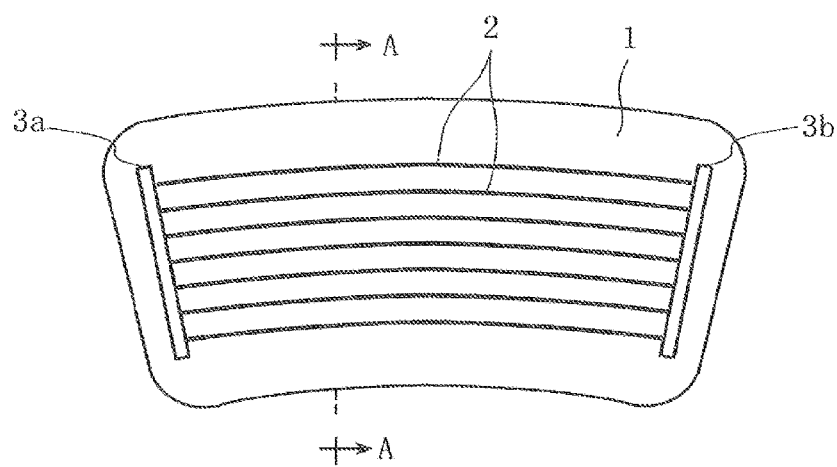
FIG. 1 is a front view illustrating an embodiment (first embodiment) of anti-fogging glass as a glass article, prepared with the use of a conductive paste according to the present invention.
Figure 2:
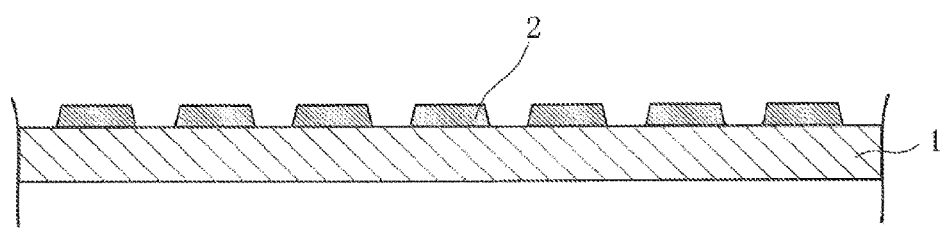
FIG. 2 is a cross-sectional view of FIG. 1 along the line A-A indicated by arrows.

FIG. 1 is a front view illustrating an embodiment of anti-fogging glass as a glass article, prepared with the use of a conductive paste according to the present invention, and FIG. 2 is a cross-sectional view of FIG. 1 along the line A-A indicated by arrows.

This anti-fogging glass has, on the surface of a glass substrate 1, multiple conductive films 2 formed in the form of fine and thin parallel lines at predetermined intervals. In addition, bus bar electrodes 3a, 3b are formed on both ends of the conductive films 2, and the bus bar electrodes 3a, 3b are connected to feeding terminals, not shown, with solder interposed therebetween.

More specifically, for this anti-fogging glass, a conductive paste is applied in the form of lines onto the glass substrate 1, and subjected to a firing treatment, thereby forming the conductive films 2 in a predetermined pattern, and resulting in the conductive films 2 fixed on the glass substrate 1. Both ends of the conductive films 2 are electrically connected through the bus bar electrodes 3a, 3b, and the bus bar electrodes 3a, 3b are connected to feeding terminals (not shown) by soldering.

The thus formed anti-fogging glass is provided, for example, as front glass and rear glass of vehicles such as automobiles, and power is supplied to the conductive films 2 from the feeding terminals through the bus bar electrodes 3a, 3b, and allowed to generate heat, thereby making it possible to achieve anti-fogging performance.

Next, the conductive paste for forming the conductive films 2 described above will be described in detail.

The present conductive paste is a conductive paste preferred for forming conductive patterns on glass substrates such as glass for automobiles, which contains at least a conductive powder, glass frit, and an organic vehicle.

The conductive powder includes a noble metal powder and a base metal powder including Cu and/or Ni, and the base metal powder has a specific surface area of less than 0.5 $m^2/g$. The use of this conductive paste can achieve glass articles such as anti-fogging glass, which have favorable weather resistance and have moderate resistivity.

Therefore, according to the present invention, the conductive powder contains therein, as a base metal powder having a predetermined amount of Cu and/or Ni that are less likely to be oxidized as compared with Zn and Fe, along with a noble metal powder, and the base metal powder has a specific surface area of less than 0.5 $m^2/g$.

More specifically, Cu and Ni as the base metal powder require lower energy for oxide production as compared with Zn and Fe, and forms a strong passivation film at the surface, thus making the powder less likely to be oxidized. Moreover, when the base metal powder is reduced in specific surface area, base metal particles are oxidized slowly during firing, rather than being oxidized rapidly, and the glass frit thus achieves ingress into voids between the noble metal powder and the glass substrate 1 while maintaining moderate wettability. As a result, the interfaces between the conductive films 2 and the glass substrate 1 can be sealed from the external environment, thereby improving the weather resistance. To that end, having the specific surface area of the base metal powder less than 0.5 $m^2/g$ is desired.

The lower limit of the specific surface area of the base metal powder is not particularly limited, but when the specific surface area is less than 0.15 $m^2/g$, there is unfavorably a possibility of increasing the maximum size of powder particles, thereby causing mesh to be clogged during screen printing.

In addition, according to the present invention, there is also a need to adjust the content of Cu and/or Ni within the following predetermined range.

More specifically, when the base metal powder is formed from Cu, there is a need to adjust the content of the base metal powder with respect to the total amount of the conductive powder such that the content ratio of the base metal powder to 0.1 to 0.3 in ratio by weight. If the content ratio of Cu is less than 0.1, there is a possibility of extremely decreasing the resistivity, due to the decreased content of Cu in the conductive powder. On the other hand, if the content ratio of Cu exceeds 0.3, the excessive content of Cu in the conductive powder causes the resistivity to be increased by oxidation of Cu during firing, and causes the weather resistance to be degraded.

In addition, when the base metal powder is formed from Ni, there is a need to adjust the content ratio of the base metal powder to the total amount of the conductive powder to 0.1 to 0.2 in ratio by weight. If the content ratio of Ni is less than 0.1, there is a possibility of extremely decreasing the resistivity as in the case of Cu, due to the low content of Ni in the conductive powder. On the other hand, if the content ratio of Ni exceeds 0.2, the excessive content of Ni in the conductive powder has a possibility of causing the weather resistance to be degraded, even though an increase in the resistivity can be avoided due to the difference in sinterability from Cu.

Furthermore, when the base metal powder is formed from a mixed powder of Cu and Ni, there is a need to adjust the content ratio of the base metal powder to the total amount of the conductive powder to 0.1 to 0.25 in ratio by weight. If the content ratio of the mixed powder of Cu and Ni is less than 0.1, there is a possibility of extremely decreasing the resistivity for the same reason as in the case of Cu or Ni. On the other hand, if the content ratio of the mixed powder exceeds 0.25, the excessive content of the mixed powder in the conductive powder has a possibility of causing the weather resistance to be decreased, as in the case of Ni.

In addition, as for the form of the mixed powder of Cu and Ni, similar effects are also achieved with the use of not only a mixed powder of a Cu powder and a Ni powder, but also an alloy powder of Cu and Ni.

It is to be noted that the content ratio of the base metal powder in the conductive powder has a lower value of 0.1 in each case, while the upper limit varies, which is thought to be mainly because Ni is more likely to be oxidized than Ni, due to the difference in ionization tendency between Cu and Ni.

As just described above, Cu and/or Ni as a base metal powder has a specific surface area of less than 0.5 $m^2/g$, and the content ratio of the base metal powder in the conductive powder falls within the predetermined range described above. Thus, the conductive paste can keep the wettability of the glass frit in the conductive paste from being decreased, thereby achieving favorable weather resistance. In addition, the resistivity can be controlled moderately, and a conductive paste can be thus achieved which is preferred for anti-fogging glass of automobiles and the like.

It is to be noted that the shape of the base metal powder is not particularly limited, but desirably spherical or substantially spherical in order to avoid the increase in specific surface area, and preferably kept as much as possible from having surface asperity, because there is a need to make the specific surface area less than 0.5 $m^2/g$. Further, the base metal powder is preferably prepared by an atomization method as a method for preparing such a base metal powder.

More specifically, various methods are known for preparing metal powders of fine particles, and typical preparation methods include a wet reduction method and an atomization method.

However, the wet reduction method is a preparation method with the use of a chemical process where an aqueous solution of a metal salt is reduced with a reductant to deposit a metal powder, and thus likely to provide surface asperity.

In contrast, the atomization method causes a flow of molten metal to be sprayed from a nozzle to make droplets, and the droplets are thereafter solidified, thereby preparing a metal powder. Therefore, the method can keep the surface of the particles from being provided with asperity, thereby providing high-quality metal powders.

Therefore, a method for preparing the base metal powder is not particularly limited, but in order to efficiently obtain the base metal powder with a specific surface area of less than 0.5 $m^2/g$, the powder is preferably prepared by an atomization method.

The average particle size $D_{50}$ of the base metal powder is not particularly limited, but the average particle size $D_{50}$ in excess of 8 μm unfavorably has a possibility of causing the mesh to be clogged during screen printing.

In addition, as for the average particle size $D_{50}$ of the base metal powder, the specific surface area varies depending on the particle shape and the surface condition, and has a tendency to increase as the particles become finer. Therefore, the average particle size $D_{50}$ of the base metal powder is preferably 2.5 μm or more.

The noble metal powder is not particularly limited, as long as the powder is a metal powder with favorable conductivity, but typically, an Ag powder can be preferably used. In addition, an Ag powder as a main constituent may contain therein various types of noble metal powders such as Pd and Pt as accessory constituents.

In addition, the shape of the noble metal powder is also not particularly limited, but may be, for example, spherical, flattened, amorphous, or the powder may be a mixed powder in these shapes.

The average particle size $D_{50}$ of the noble metal powder is also not particularly limited, but from the perspective of ensuring the mechanical strength and the like, the average particle size $D_{50}$ is preferably 0.1 to 3 μm. If the average particle size $D_{50}$ of the noble metal powder is less than 0.1 μm, the viscosity is increased during the paste preparation, thereby making it difficult to make paste. On the other hand, if the average particle size $D_{50}$ of the conductive powder exceeds 3 μm, there is a possibility that the presence of desired grown crystal grains between particles in the conductive powder will lack during firing, thereby causing the mechanical strength to be decreased.

In addition, the content of the conductive powder in the conductive paste is not particularly limited, but preferably 50 to 90 wt %. If the content of the conductive powder is less than 50 wt %, the content of the glass frit is relatively increased. Thus, in order to ensure desired conductivity, there is a need to increase the line width or make the conductive film thicker, thereby possibly causing the cost to be increased. On the other hand, if the content of the conductive powder exceeds 90 wt %, the excessive conductive powder has a possibility of making it difficult to make paste. Therefore, while the content of the conductive powder is not particularly limited, it is preferably 50 to 90 wt %.

In addition, the composition of the glass frit is not particularly limited, but there is a need to melt the glass frit at the firing temperature, thereby causing the glass frit to flow so as to avoid a decrease in sintered density and insufficient sealing at the interfaces of the conductive films 2. Further, for glass articles such as anti-fogging glass, it is preferable to use glass frit that has the composition adjusted so that the softening point is approximately 350 to 600° C., because of typical firing at a temperature of approximately 500 to 800° C.

In addition, the constituents of the glass frit are not particularly limited, but can be selected from various types of oxides such as $Bi_2O_3$, PbO, $SiO_2$, $B_2O_3$, $Al_2O_3$, BaO, CaO, SrO, ZnO, $Na_2O$, $K_2O$, $Li_2O$, $Sb_2O_3$, FeO, and CuO, in consideration of softening point and chemical durability.

In addition, the average particle size $D_{50}$ of the glass frit is also not particularly limited, but voids between the noble metal powder and the glass substrate 1 are desirably filled uniformly with the glass frit, and from the perspective, the average particle size $D_{50}$ of the glass frit is desirably 2 times or less of the average particle size $D_{50}$ of the noble metal powder.

In addition, the organic vehicle is prepared so that a binder resin and an organic solvent are, for example, 1 to 3:7 to 9 in volume ratio. It is to be noted that the binder resin is not particularly limited, but for example, an ethyl cellulose resin, a nitrocellulose resin, an acrylic resin, an alkyd resin, or a combination thereof can be used as the binder resin. In addition, the organic solvent is also not particularly limited, but α-terpineol, xylene, toluene, diethylene glycol monobutylether, diethylene glycol monobutylether acetate, diethylene glycol monoethylether, diethylene glycol monoethylether acetate, and the like can be used either alone or in combination.

Further, this conductive paste can be easily manufactured by weighing and mixing the noble metal powder, the base metal powder including Cu and/or Ni, the glass frit, and the organic vehicle so as to reach predetermined mixture proportions, and dispersing/kneading the mixture with the use of a 3 roll mill or the like.

As just described above, according to the present embodiment, the conductive paste contains the noble metal powder such as an Ag powder, the base metal powder including Cu and/Ni, the glass frit, and the organic vehicle, where the base metal powder has a specific surface area of less than 0.5 $m^2/g$, and the content ratio of the base metal powder to the total amount of the conductive powder falls within a predetermined range. Thus, a conductive paste suited for forming conductive films of anti-fogging glass and the like can be achieved which has favorable weather resistance, and also has resistivity controlled moderately.

Figure 3:
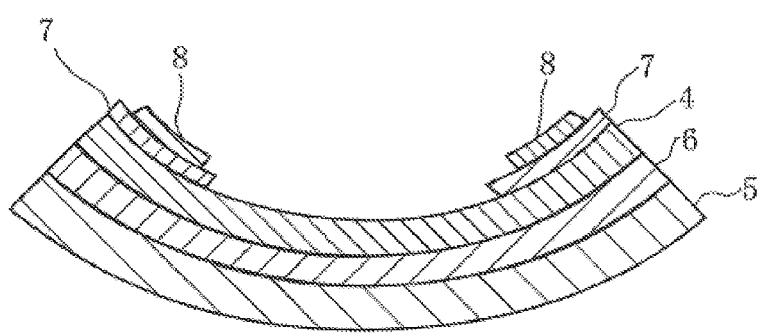
FIG. 3 is a cross-sectional view schematically illustrating a glass antenna as a second embodiment of a glass article according to the present invention.

FIG. 3 is a main cross-sectional view illustrating an example of a glass antenna as a second embodiment of a glass article according to the present invention.

This glass antenna has a structure in consideration of impact resistance such that, as laminated glass, an intermediate film 6 made of polyvinyl alcohol resin or the like is interposed between multiple glass substrates (first and second glass substrates 4, 5).

Further, ceramic layers 7 are formed on the surface of the first glass substrate 4, and conductive films 8 in predetermined patterns, which have an antenna function, are formed on the surfaces of the ceramic layers 7. The conductive films 8 are joined to feeding terminal (not shown) by soldering, and as with anti-fogging glass, for example, provided as window glass for vehicles such as automobiles to receive radio waves from the outside for radios and televisions.

This glass antenna is prepared in the following way. A ceramic paste containing, as its main constituent, a ceramic material containing glass frit is applied onto the first glass substrate 4, and dried. Then, the conductive paste according to the present invention is applied so as to provide a predetermined antenna pattern on the ceramic paste, and dried. Thereafter, the ceramic paste and the conductive paste are subjected to co-firing, and thereafter, the intermediate film 6 is attached with an adhesive so as to be sandwiched between the first glass substrate 4 and the second glass substrate 5, thereby preparing a glass antenna.

The formation of the conductive film 8 with the use of the conductive paste according to the present invention can achieve a glass antenna which has favorable weather resistance, and resistivity controlled moderately, as in the first embodiment.

It is to be noted that the present invention is not limited to the embodiments described above. For example, while cases of the base metal powder formed from Cu and/or Ni have been described in the embodiments mentioned above, the base metal powder should contain Cu and/or Ni as its main constituent, and may contain other base metal constituents in minute amounts, to the extent that characteristics are not affected. In addition, the powder may contain various types of inorganic constituents, if necessary, to the extent that characteristics are not affected. The powder may contain, for example, Zr, P, V, Ce, Nb, Ta, W, Pd, Ag, Ru, Sn, In, Y, Dy, La, and the like. In addition, the contained form is not particularly limited, and can be selected appropriately from oxides, hydroxides, peroxides, halides, carbonates, nitrates, phosphates, sulfates, fluorides, organometallic compounds, and the like.

In addition, it is also preferable to add to the conductive paste plasticizers such as phthalic acid di 2-ethylhexyl and dibutyl phthalate, or a combination thereof, if necessary. It is also preferable to add a rheology modifier such as a fatty acid amide and a fatty acid, and a thixotropic agent, a thickener, a dispersant, and the like.

Next, an example of the present invention will be specifically described.

EXAMPLES

Preparation of Sample

An Ag powder of 1.3 μm in average particle size $D_{50}$ was prepared as a noble metal powder, nine types (powder samples A to I) of Cu powders or Ni powders with specific surface areas and average particle sizes $D_{50}$ as shown in Table 1 were prepared as a base metal powder, and Bi—B—Si—O based glass frit of 2 μm in average particle size $D_{50}$ was further prepared.

In addition, the specific surface areas were measured by a 1-point BET method, and the average particle sizes $D_{50}$ were measured with a laser-diffraction particle size distribution measurement device.

It is to be noted that the Cu powder for the powder sample E and the Ni powder for the powder sample I were prepared by a wet reduction method, whereas the other Cu powders or Ni powders were all prepared by an atomization method.

TABLE 1

| Sample No. | Base Metal Powder | Specific Surface Area (m²/g) | Average Particle Size D₅₀ (μm) | Preparation Method |
|---|---|---|---|---|
| A | Cu | 0.15 | 7.8 | Atomization Method |
| B |  | 0.25 | 5.1 |  |
| C |  | 0.49 | 3.0 |  |
| D* |  | 0.50 | 3.3 |  |
| E* |  | 0.58 | 5.0 | Wet Reduction Method |
| F | Ni | 0.14 | 8.0 | Atomization Method |
| G |  | 0.27 | 5.5 |  |
| H |  | 0.48 | 2.5 |  |
| I* |  | 0.77 | 2.8 | Wet Reduction Method |

*outside the scope of the present invention

As is clear from Table 1, the powder samples A to C and F to H are all base metal powders within the scope of the preset invention, with specific surface areas of less than 0.50 m²/g. On the other hand, the powder samples D, E, and I are base metal powders outside the scope of the preset invention, with specific surface areas of 0.50 m²/g or more.

In addition, an organic vehicle was prepared by the following method. More specifically, an ethyl cellulose resin and terpineol were mixed so that the ethyl cellulose resin was 10 wt % as a binder resin, whereas the terpineol was 90 wt % as an organic solvent, thereby preparing the organic vehicle.

Next, the formulation ratio between the Ag powder and the base metal powder (Cu powder, Ni powder) was adjusted such that the content ratio of the base metal powder in the conductive powder was obtained as shown in Table 2 in ratio by weight, and the conductive powder (the noble metal powder and the base metal powder), the glass frit, and the organic vehicle were further formulated such that the total content of the conductive powder was 70 wt %, the content of the glass frit was 8 wt %, and the rest was the organic vehicle, mixed with a planetary mixer, and then dispersed and kneaded with a 3 roll mill, thereby preparing conductive pastes of sample numbers 1 to 18.

[Evaluation of Sample]

A glass slide of length: 76 mm, width: 26 mm, and thickness: 1.4 mm was prepared, and subjected to screen printing with the use of the conductive paste mentioned above so as to achieve total line length L: 100 mm and line width W: 0.5 mm, thereby forming a conductive pattern on the glass slide. Then, this glass slide was dried for 10 minutes at a temperature of 150° C., and then subjected to firing for 5 minutes at a maximum temperature of 600° C., thereby providing samples of sample numbers 1 to 18 with conductive films formed on the surfaces.

Next, a voltage was applied to both ends of the conductive film, and the resistance value was measured with a digital resistance meter. Then, a cross-sectional area of the conductive film was measured with a contact-type surface roughness meter, and the resistivity was calculated from the cross-sectional area and the total line length L (=100 mm).

Next, each sample of sample numbers 1 to 18 was immersed in a 10% NaCl solution for 120 hours. Then, this sample was taken out of the NaCl solution, sufficiently washed with water, and dried. Thereafter, a pressure-sensitive adhesive tape was attached to the surface of the conductive film, the pressure-sensitive adhesive tape was peeled off from the sample, and the weather resistance was evaluated from the resistance change rate of the conductive film.

Table 2 shows the types of the base metal powders used for sample numbers 1 to 18, the content ratios of the base metal powders in the conductive powders, and the measurement results.

It is to be noted that the samples of 5.0 to 18.0 μΩ·cm in resistivity were determined to be non-defective products, whereas the other samples were determined to be defective products, thereby evaluating the samples for conductivity. This is because of taking into consideration the fact that the resistivity preferred for battery voltage is 5.0 to 18.0 μΩ·cm in view of mainstream battery voltages of 12 to 24 V now.

In addition, the samples of less than 5% in the resistance change rate of the conductive film were determined to be non-defective products "○", whereas the samples in excess of 5% in the resistance change rate were determined to be defective products "x", thereby evaluating the samples for weather resistance.

TABLE 2

| Sample No. | Base Metal Powder No. | Content Ratio of Base Metal Powder (—) | Resistivity (μΩ · cm) | Weather Resistance |
|---|---|---|---|---|
| 1 | A | 0.20 | 8.6 | ○ |
| 2 | B | 0.20 | 9.5 | ○ |
| 3 | C | 0.20 | 12.1 | ○ |
| 4* | D | 0.20 | 15.2 | X |
| 5* | E | 0.20 | 16.6 | X |
| 6 | C | 0.10 | 5.3 | ○ |
| 7* | C | 0.05 | 4.2 | ○ |
| 8 | A | 0.30 | 15 | ○ |
| 9* | A | 0.40 | 26.3 | X |
| 10 | F | 0.20 | 9.1 | ○ |
| 11 | G | 0.20 | 9.8 | ○ |
| 12 | H | 0.20 | 12.4 | ○ |
| 13* | I | 0.20 | 16.9 | X |
| 14 | H | 0.10 | 5.2 | ○ |
| 15* | H | 0.05 | 4.5 | ○ |
| 16* | F | 0.25 | 16.7 | X |
| 17 | B | 0.05 | 5.6 | ○ |
|  | G | 0.05 |  |  |
| 18 | B | 0.15 | 13.1 | ○ |
|  | G | 0.10 |  |  |

*outside the scope of the present invention

It has been determined that sample number 4 has, because the Cu powder as the base metal powder has a large specific surface area of 0.50 m²/g, a favorable resistivity of 15.2 μΩ·cm, but inferior weather resistance. This is thought to be because, due to the large specific surface area of the Cu powder, the oxidation of the Cu powder during the firing proceeded rapidly, thereby significantly decreasing the wettability of the glass frit.

It has been determined that sample number 5 has, because the Cu powder has a large specific surface area of 0.58 m²/g, a favorable resistivity of 16.6 μΩ·cm for substantially the same reason as with sample number 1, but inferior weather resistance.

Sample number 7 has, because of the low content ratio of the Cu powder, which is 0.05, favorable weather resistance, but a decreased resistivity of 4.2 μΩ·cm.

Sample 9 has, because the content ratio of the Cu powder is high, which is 0.40, a resistivity increased, and also weather resistance degraded. This is thought to be because, due to the high content ratio of the Cu powder, the oxidation amount of the Cu powder during the firing increased, thereby significantly decreasing the wettability of the glass frit.

It has been determined that sample number 13 has, because the Ni powder as the base metal powder has a large specific surface area of 0.77 m²/g, a favorable resistivity of 16.9 μΩ·cm for the same reason as described for sample number 4, but inferior weather resistance.

Sample number 15 has, because of the low content ratio of the Ni powder, which is 0.05, favorable weather resistance, but a decreased resistivity of 4.5 μΩ·cm.

Sample number 16 has, because the content ratio of the Ni powder is high, which is 0.25, a favorable resistivity of 16.7 μΩ·cm for the same reason as described for sample number 9, but weather resistance degraded.

In contrast, sample numbers 1 to 3, 6, and 8 have favorable resistivities of 5.3 to 16.6 μΩ·cm, and also have favorable weather resistance, because the specific surface areas are 0.15 to 0.48 m²/g, which are less than 0.50 m²/g, and the conductive pastes contain therein the Cu powders within the scope of the present invention, of which the content ratios are 0.10 to 0.30.

In addition, sample numbers 10 to 12 and 14 have favorable resistivities of 5.2 to 16.9 μΩ·cm, and also have favorable weather resistance, because the specific surface areas are 0.14 to 0.48 m²/g, which are less than 0.50 m²/g, and the conductive pastes contain therein the Ni powders within the scope of the present invention, of which the content ratios are 0.10 to 0.20.

In addition, sample numbers 17 and 18 have favorable resistivities of 5.6 to 13.1 μΩ·cm, and also have favorable weather resistance, because the specific surface areas are 0.25 to 0.27 m²/g, which are less than 0.50 m²/g, and the conductive pastes contain therein the mixed powders of the Cu powders and Ni powders within the scope of the present invention, of which the content ratios are 0.10 to 0.25.

The present conductive paste has favorable weather resistance, and moderate resistivity, and can be used in a preferred manner for glass articles such as anti-fogging glass and glass antennas for vehicles.

DESCRIPTION OF REFERENCE SYMBOLS

1: glass substrate
2: conductive film
4: first glass substrate (glass substrate)
7: ceramic layer
8: conductive film

The invention claimed is:

1. A conductive paste comprising:
a conductive powder;
glass frit; and
an organic vehicle,
wherein
the conductive powder contains a noble metal powder and a base metal powder containing at least one of Cu and Ni as a main constituent thereof,
the base metal powder has a specific surface area of less than 0.5 m²/g, and
a content of the base metal powder with respect to a total amount of the conductive powder is, in ratio by weight:
0.1 to 0.3 when the base metal powder contains the Cu as the main constituent thereof;
0.1 to 0.2 when the base metal powder contains the Ni as the main constituent thereof; and
0.1 to 0.25 when the base metal powder contains a mixture of the Cu and the Ni as the main constituent thereof.

2. The conductive paste according to claim 1, wherein specific surface area of the base metal powder is 0.15 to 0.5 m²/g.

3. The conductive paste according to claim 1, wherein the base metal powder is an atomized powder.

4. The conductive paste according to claim 1, wherein the base metal powder is 8 μm or less in average particle size.

5. The conductive paste according to claim 1, wherein the base metal powder is 2.5 to 8.0 μm in average particle size.

6. The conductive paste according to claim 1, wherein the noble metal powder is 0.1 to 3 μm in average particle size.

7. The conductive paste according to claim 1, wherein a content of the conductive powder is 50 to 90 wt % of the conductive paste.

8. The conductive paste according to claim 1, wherein an average particle size of the glass frit is 2 times or less of an average particle size of the noble metal powder.

9. The conductive paste according to claim 1, wherein the glass frit has a softening point of 350° C. to 600° C.

10. The conductive paste according to claim 1, wherein the noble metal powder contains Ag as a main constituent thereof.

11. A glass article comprising:
a glass substrate; and
a conductive film in a predetermined pattern on the glass substrate, wherein
the conductive film is formed from the conductive paste according to claim 1.

12. The glass article according to claim 11, further comprising a ceramic layer interposed between the glass substrate and the conductive film.

13. The glass article according to claim 11, wherein specific surface area of the base metal powder in the conductive paste is 0.15 to 0.5 m²/g.

14. The glass article according to claim 11, wherein the base metal powder in the conductive paste is an atomized powder.

15. The glass article according to claim 11, wherein the base metal powder in the conductive paste is 2.5 to 8.0 μm in average particle size.

16. The glass article according to claim 11, wherein the noble metal powder in the conductive paste is 0.1 to 3 μm in average particle size.

17. The glass article according to claim 11, wherein a content of the conductive powder in the conductive paste is 50 to 90 wt % of the conductive paste.

18. The glass article according to claim 11, wherein an average particle size of the glass frit in the conductive paste is 2 times or less of an average particle size of the noble metal powder in the conductive paste.

19. The glass article according to claim 11, wherein the glass frit in the conductive paste has a softening point of 350° C. to 600° C.

20. The glass article according to claim 11, wherein the noble metal powder in the conductive paste contains Ag as a main constituent thereof.

* * * * *